(12) United States Patent
Sasaki et al.

(10) Patent No.: US 10,684,735 B2
(45) Date of Patent: Jun. 16, 2020

(54) CAPACITIVE SENSOR AND DEVICE

(71) Applicant: Alps Alpine Co., Ltd, Ota-ku, Tokyo (JP)

(72) Inventors: Makoto Sasaki, Miyagi-ken (JP); Manabu Yazawa, Miyagi-ken (JP)

(73) Assignee: Alps Alpine Co., Ltd., Tokyo (JP)

( * ) Notice: Subject to any disclaimer, the term of this patent is extended or adjusted under 35 U.S.C. 154(b) by 0 days.

(21) Appl. No.: 16/414,288

(22) Filed: May 16, 2019

(65) Prior Publication Data

US 2019/0272054 A1    Sep. 5, 2019

Related U.S. Application Data

(63) Continuation of application No. PCT/JP2017/039153, filed on Oct. 30, 2017.

(30) Foreign Application Priority Data

Dec. 12, 2016   (JP) .................................. 2016-240674

(51) Int. Cl.
*G06F 3/044*      (2006.01)
*B32B 15/04*     (2006.01)
(Continued)

(52) U.S. Cl.
CPC .............. *G06F 3/044* (2013.01); *B32B 15/04* (2013.01); *G06F 3/041* (2013.01); *H01B 5/14* (2013.01);
(Continued)

(58) Field of Classification Search
CPC ..................... G06F 3/044; G06F 3/041; G06F 2203/04102; G06F 2203/04111;
(Continued)

(56) References Cited

U.S. PATENT DOCUMENTS

2019/0220117 A1*   7/2019   Yamai et al.

FOREIGN PATENT DOCUMENTS

| JP | S58-166437 | 10/1983 |
| JP | 2013-178738 | 9/2013 |

(Continued)

OTHER PUBLICATIONS

International Search Report from International Application No. PCT/JP2017/039153 dated Nov. 28, 2017.

*Primary Examiner* — Abhishek Sarma
(74) *Attorney, Agent, or Firm* — Beyer Law Group LLP

(57) ABSTRACT

A capacitive sensor includes first transparent electrodes arranged in a first direction; second transparent electrodes arranged in a second direction intersecting the first direction and containing conductive nanowires; coupling parts provided integrally with the first transparent electrodes; and bridge wiring parts provided independently of the second transparent electrodes so as to intersect the coupling parts and electrically connecting two adjacent second transparent electrodes to each other. Each of the bridge wiring parts is composed of contact portions in contact with the second transparent electrodes and a bridge portion provided continuously with the contact portions and separated from the second transparent electrodes. Each of the contact portions has a multilayer structure, and a layer including a portion in contact with the second transparent electrode is formed of a zinc-oxide-based material. A surface of the bridge portion located farther from the substrate is formed of an amorphous-oxide-based material.

11 Claims, 7 Drawing Sheets

(51) Int. Cl.
     *H01B 5/14*           (2006.01)
     *H01L 31/0224*    (2006.01)
     *H01L 31/18*       (2006.01)
     *G06F 3/041*       (2006.01)
     *B82Y 30/00*       (2011.01)

(52) U.S. Cl.
     CPC .. *H01L 31/022466* (2013.01); *H01L 31/1884* (2013.01); *B82Y 30/00* (2013.01); *G06F 2203/04102* (2013.01); *G06F 2203/04111* (2013.01); *G06F 2203/04112* (2013.01)

(58) Field of Classification Search
     CPC ......... G06F 2203/04112; G06F 3/0446; G06F 3/0443; G06F 3/0445; B32B 15/04; H01B 5/14; H01B 1/02; H01B 1/08; H01L 31/022466; H01L 31/1884; B82Y 30/00
     See application file for complete search history.

(56) References Cited

FOREIGN PATENT DOCUMENTS

| | | |
|---|---|---|
| JP | 2014-10516 | 1/2014 |
| JP | 2015-118537 | 6/2015 |

\* cited by examiner

CAPACITIVE SENSOR AND DEVICE

CLAIM OF PRIORITY

This application is a Continuation of International Application No. PCT/JP2017/039153 filed on Oct. 30, 2017, which claims benefit of Japanese Patent Application No. 2016-240674 filed on Dec. 12, 2016. The entire contents of each application noted above are hereby incorporated by reference.

BACKGROUND OF THE INVENTION

1. Field of the Invention

The present invention relates to capacitive sensors, and particularly to a capacitive sensor having transparent electrodes containing conductive nanowires and a device including such a capacitive sensor.

2. Description of the Related Art

Japanese Unexamined Patent Application Publication No. 58-166437 discloses a finger-touch sensing panel having X and Y electrodes formed of indium tin oxide (ITO) layers on a transparent glass substrate. The finger-touch sensing panel described in this publication has areas where the X and Y electrodes cross each other. The Y electrodes are electrically connected together by conductor films via openings. Thus, the X and Y electrodes cross each other on the substrate, and bridge wiring parts are provided to electrically connect the Y electrodes together, which allows for a reduction in the thickness of the sensing panel.

As the market trend, there is a need for curved capacitive sensors and flexible capacitive sensors. Accordingly, for example, materials containing conductive nanowires such as gold nanowires, silver nanowires, and copper nanowires are occasionally used as materials for transparent electrodes in capacitive sensors.

However, the use of a material containing conductive nanowires as a material for transparent electrodes has a problem in that the contact area between the transparent electrodes and bridge wiring parts provided at the intersections of the electrodes is relatively narrow. Specifically, in the case of conductive nanowires, conductive wires exposed in the surfaces of the transparent electrodes are responsible for ensuring sufficient conductivity and transparency. Therefore, if the bridge wiring parts are formed of a material containing conductive nanowires, the contacts between the transparent electrodes and the bridge wiring parts are wire-to-wire contacts. Alternatively, if the bridge wiring parts are formed of, for example, an oxide-based material such as ITO, the contacts between the transparent electrodes and the bridge wiring parts are wire-to-surface contacts. Thus, the use of a material containing conductive nanowires as a material for the transparent electrodes results in a relatively narrow contact area between the transparent electrodes and the bridge wiring parts.

Consequently, the conduction stability may decrease. In addition, if a large current flows through the contact portions between the transparent electrodes and the bridge wiring parts in the event of electrostatic discharge (ESD), the contact portions may heat up locally and may thus melt and break. That is, although the use of a material containing conductive nanowires as a material for the transparent electrodes improves the deformation performance of the capacitive sensor, its conduction stability and ESD tolerance may decrease. In addition, the use of a crystalline oxide-based material or metal-based material as a material for the bridge wiring parts may increase the resistance during bending and may also lead to a break in the bridge wiring parts.

One possible solution to such problems is to increase the contact area between the transparent electrodes and the bridge wiring parts by increasing the size of the bridge wiring parts. Increasing the size of the bridge wiring parts, however, has a problem in that the bridge wiring parts become more visible.

SUMMARY OF THE INVENTION

The present invention provides a capacitive sensor with superior conduction stability and sufficient invisibility of bridge wiring parts and a device including such a capacitive sensor.

One aspect of the present invention provides a capacitive sensor including a light-transmissive substrate; a plurality of first transparent electrodes arranged side by side in a sensing region of one main surface of the substrate in a first direction, the first transparent electrodes being light-transmissive; a plurality of second transparent electrodes arranged side by side in the sensing region in a second direction intersecting the first direction, the second transparent electrodes being light-transmissive and containing conductive nanowires; coupling parts provided integrally with the first transparent electrodes and electrically connecting two adjacent first transparent electrodes to each other; and bridge wiring parts provided independently of the second transparent electrodes so as to intersect the coupling parts and electrically connecting two adjacent second transparent electrodes to each other. Each of the bridge wiring parts is composed of two contact portions, each in contact with one of the two adjacent second transparent electrodes, and a bridge portion provided continuously with the contact portions and separated from the two adjacent second transparent electrodes. Each of the contact portions has a multilayer structure, and a layer including a portion in contact with the second transparent electrode is formed of a zinc-oxide-based material. A surface of the bridge portion located farther from the substrate is formed of an amorphous-oxide-based material.

A layer formed of a zinc-oxide-based material tends to have a lower contact resistance with the second transparent electrodes containing the conductive nanowires than a layer formed of an amorphous-oxide-based material. On the other hand, a layer formed of a zinc-oxide-based material is more visible than a layer formed of an amorphous-oxide-based material. Accordingly, as described above, the layers of the bridge wiring parts that are in contact with the second transparent electrodes are formed of a zinc-oxide-based material to reduce the contact resistance between the bridge wiring parts and the second transparent electrodes, whereas the surfaces of the bridge wiring parts on the viewer side are formed of an amorphous-oxide-based material to enhance the invisibility of the bridge wiring parts. Thus, a capacitive sensor with superior conduction stability and sufficient invisibility of bridge wiring parts can be provided.

A layer of each of the contact portions that is farthest from the second transparent electrodes is preferably formed of an amorphous-oxide-based material.

The bridge portion may be formed of the amorphous-oxide-based material. The bridge portion may have a multilayer structure, and a layer provided continuously with the layers closest to the second transparent electrodes and formed of a zinc-oxide-based material may be located closer to the substrate than is a layer formed of the amorphous-oxide-based material.

The zinc-oxide-based material may include at least one of zinc oxide and indium zinc oxide. The conductive nanowires may be at least one selected from the group consisting of gold nanowires, silver nanowires, and copper nanowires. The amorphous-oxide-based material may be at least one selected from the group consisting of amorphous ITO, amorphous GZO, amorphous AZO, and amorphous FTO.

Another aspect of the present invention provides a device including the above capacitive sensor.

DESCRIPTION OF THE PREFERRED EMBODIMENTS

Figure 1:
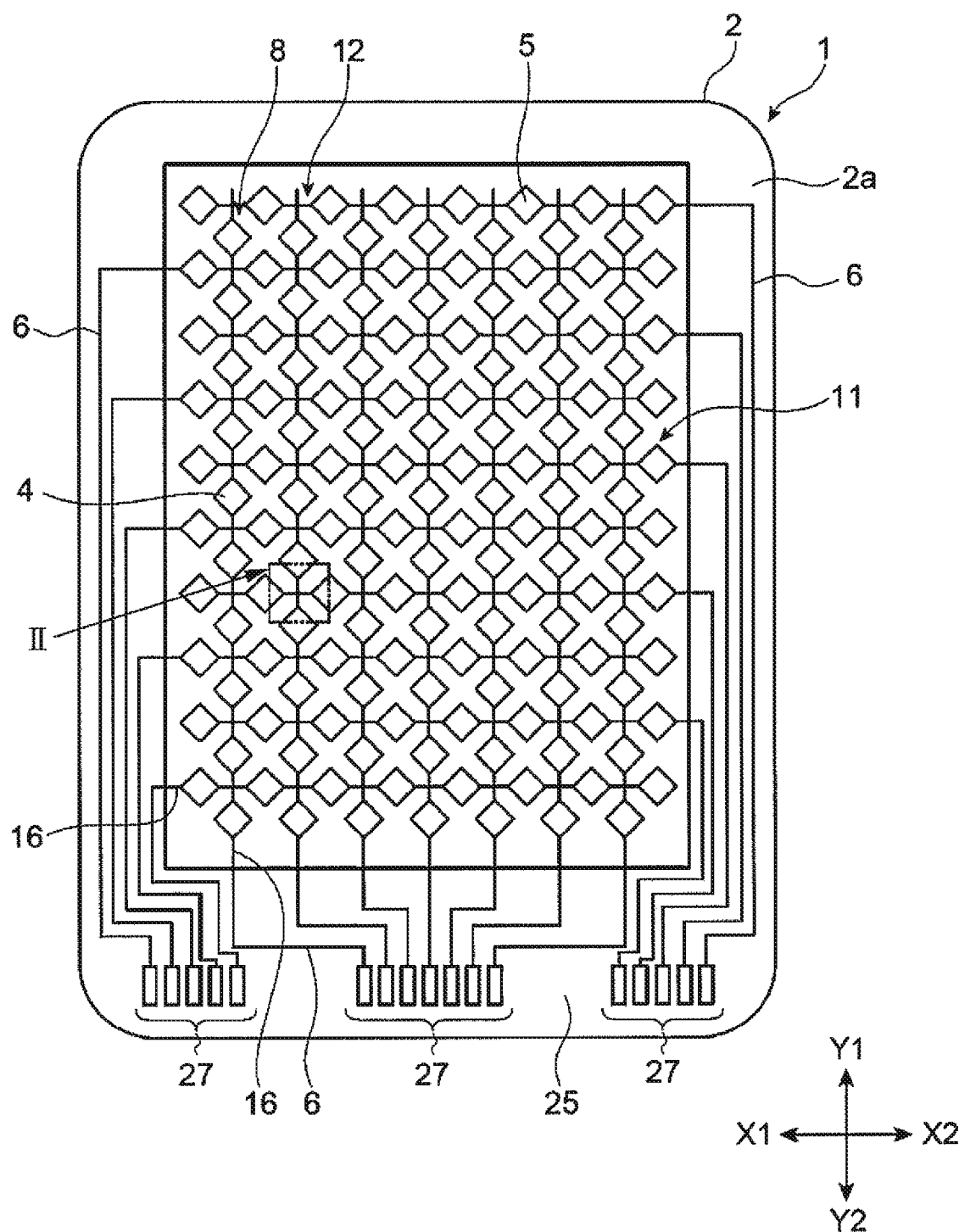
FIG. 1 is a plan view of a capacitive sensor according to an embodiment.

An embodiment of the present invention will hereinafter be described with reference to the drawings. In the drawings, similar components are denoted by the same reference numerals, and a detailed description thereof is omitted where appropriate.

Figure 2:
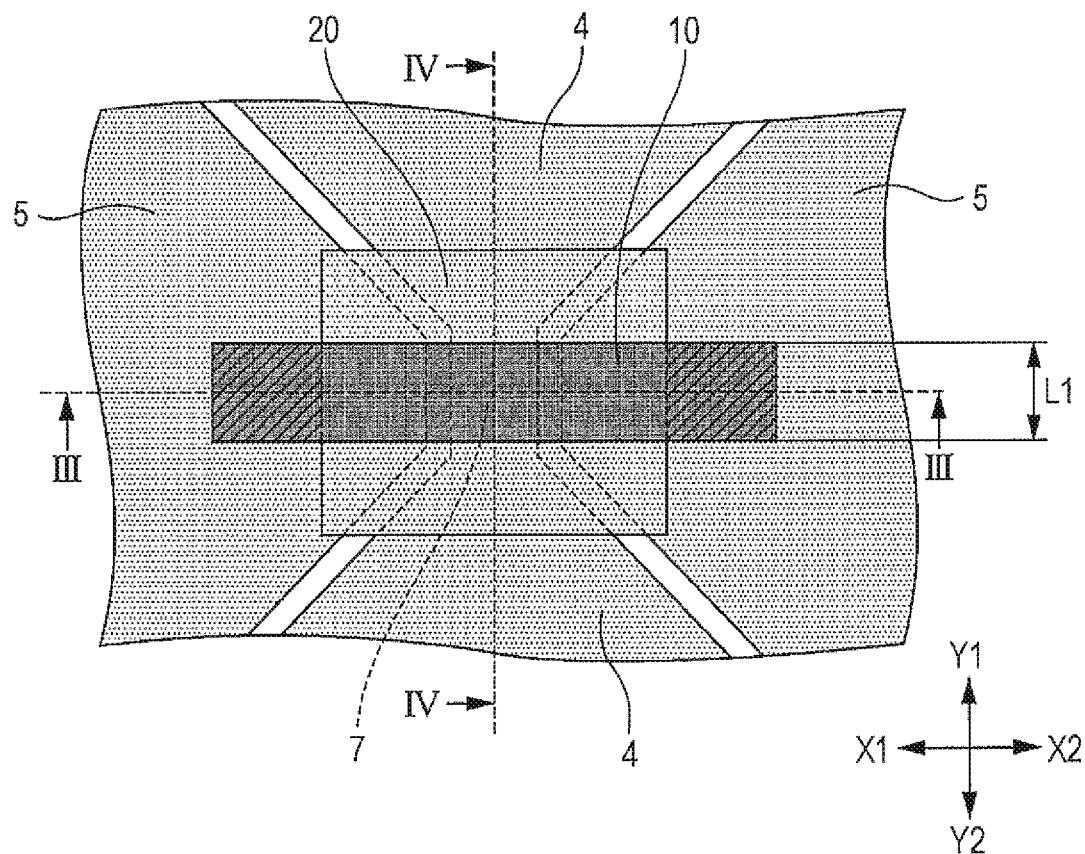
FIG. 2 is an enlarged plan view of an area II shown in FIG. 1.
Figure 3:
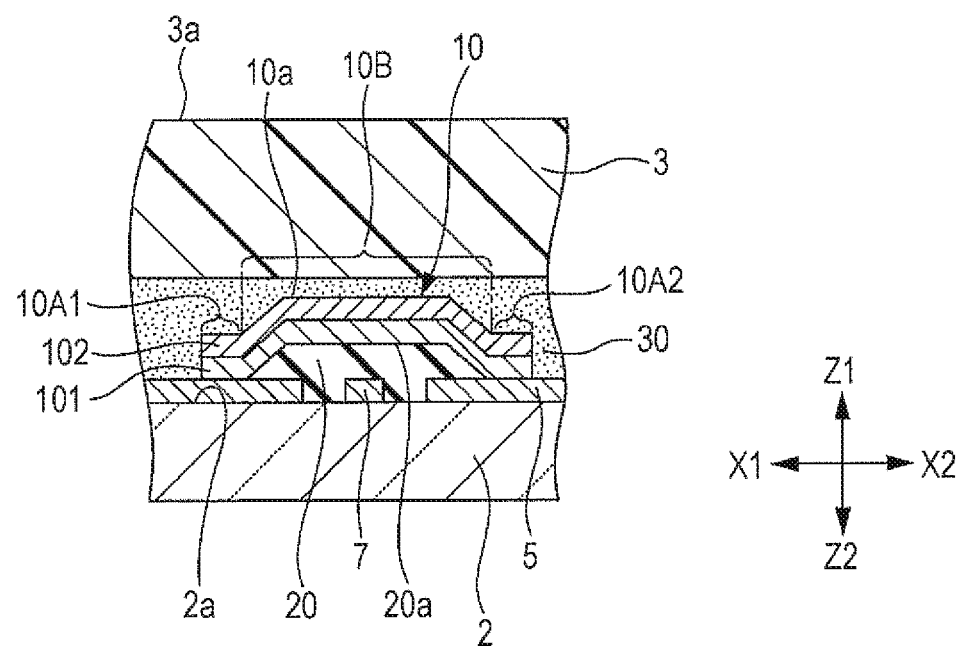
FIG. 3 is a sectional view taken along line III-III shown in FIG. 2.
Figure 4:
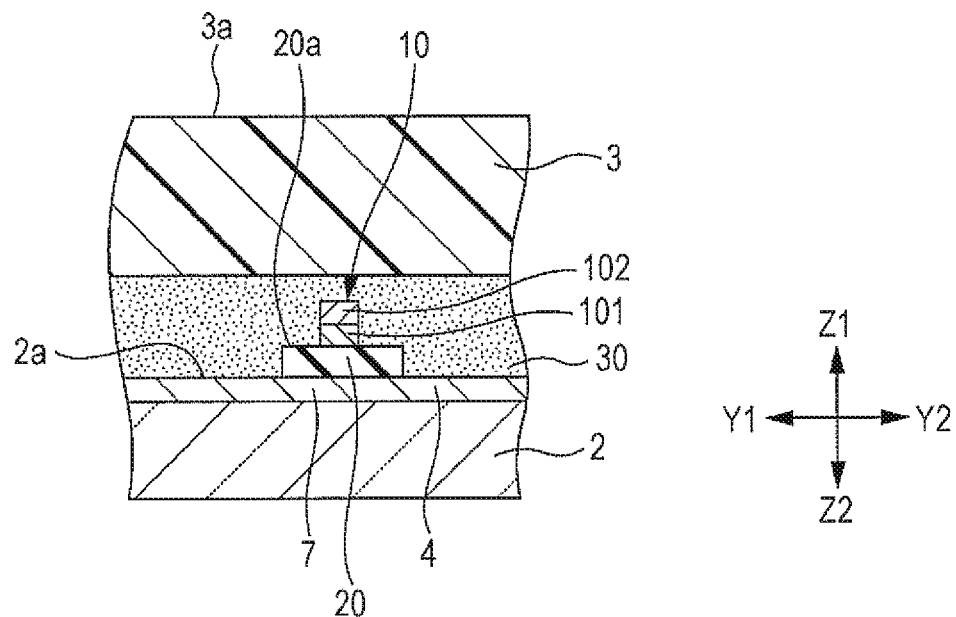
FIG. 4 is a sectional view taken along line IV-IV shown in FIG. 2.

FIG. 1 is a plan view of a capacitive sensor according to this embodiment. FIG. 2 is an enlarged plan view of an area II shown in FIG. 1. FIG. 3 is a sectional view taken along line III-III shown in FIG. 2. FIG. 4 is a sectional view taken along line IV-IV shown in FIG. 2.

Although transparent electrodes are transparent and therefore invisible by nature, the contours of the transparent electrodes are shown in FIGS. 1 and 2 for ease of understanding. As used herein, "transparent" and "light-transmissive" refer to a visible light transmittance of 50% or more (preferably 80% or more). In addition, a haze of 6% or less is suitable. As used herein, "block light" and "light-blocking" refer to a visible light transmittance of less than 50% (preferably less than 20%).

As shown in FIGS. 1 to 4, a capacitive sensor 1 according to this embodiment includes a substrate 2, first transparent electrodes 4, second transparent electrodes 5, coupling parts 7, bridge wiring parts 10, and a protective layer 3. An optical clear adhesive layer 30 is disposed between the substrate 2 and the protective layer 3. Insulating layers 20 are disposed between the substrate 2 and the bridge wiring parts 10. As shown in FIG. 3, the optical clear adhesive layer 30 is disposed between the bridge wiring parts 10 and the protective layer 3 in the areas where the bridge wiring parts 10 are disposed.

The substrate 2 is light-transmissive and is formed of, for example, a film-shaped transparent substrate such as a polyethylene terephthalate (PET) film or a glass substrate. The first transparent electrodes 4 and the second transparent electrodes 5 are disposed on one main surface 2a of the substrate 2. The details will be described later. As shown in FIG. 3, the protective layer 3 is disposed on the side of the bridge wiring parts 10 facing away from the substrate 2 and is light-transmissive. Examples of materials for the protective layer 3 include light-transmissive plastic substrates such as polycarbonate substrates. The protective layer 3 is bonded to the substrate 2 with the optical clear adhesive (OCA) layer 30 disposed between the substrate 2 and the protective layer 3. The optical clear adhesive (OCA) layer 30 is formed of, for example, an adhesive layer containing an acrylic adhesive or a double-sided acrylic tape.

As shown in FIG. 1, the capacitive sensor 1 is composed of a sensing region 11 and a non-sensing region 25 as viewed in the direction normal to the surface on the protective layer 3 side (Z1-Z2 direction). The sensing region 11 is a region that can be manipulated by a manipulating object such as a finger. The non-sensing region 25 is a frame-shaped region located outside the sensing region 11. In the non-sensing region 25, light is blocked by a decorative layer (not shown). Thus, light traveling from the surface on the protective layer 3 side toward the surface on the substrate 2 side of the capacitive sensor 1 (e.g., external light) and light traveling from the surface on the substrate 2 side toward the surface on the protective layer 3 side of the capacitive sensor 1 (e.g., light coming from a backlight of a display device used in combination with the capacitive sensor 1) are unlikely to pass through the non-sensing region 25.

As shown in FIG. 1, first electrode strings 8 and second electrode strings 12 are disposed on the main surface 2a of the substrate 2. The first electrode strings 8 are arranged in the sensing region 11 and include a plurality of first transparent electrodes 4. As shown in FIGS. 3 and 4, of the main surfaces of the substrate 2 to which the direction along the Z1-Z2 direction is normal, the plurality of first transparent electrodes 4 are disposed on the main surface 2a located on the Z1 side (which may be hereinafter abbreviated as "front surface"). The individual first transparent electrodes 4 are coupled together via the elongated coupling parts 7 in the Y1-Y2 direction (first direction). The first electrode strings 8, which include the plurality of first transparent electrodes 4 coupled together in the Y1-Y2 direction, are arranged at a distance from each other in the X1-X2 direction. The coupling parts 7 are formed integrally with the first transparent electrodes 4. The coupling parts 7 electrically connect two adjacent first transparent electrodes 4 to each other.

The first transparent electrodes 4 and the coupling parts 7 are light-transmissive and are formed of a material containing conductive nanowires. The conductive nanowires may be at least one selected from the group consisting of gold nanowires, silver nanowires, and copper nanowires. The use of a material containing conductive nanowires allows the first transparent electrodes 4 to have high light transmissivity and low electrical resistance. In addition, the use of a material containing conductive nanowires improves the deformation performance of the capacitive sensor 1.

The material containing the conductive nanowires includes conductive nanowires and a transparent resin layer. The conductive nanowires are dispersed in the resin layer. The resin layer ensures the dispersibility of the conductive nanowires. Examples of materials for the transparent resin layer include polyester resins, acrylic resins, and polyurethane resins. A plurality of conductive nanowires are at least partially in contact with each other, thus maintaining the in-plane conductivity of the material containing the conductive nanowires.

The second electrode strings 12 are arranged in the sensing region 11 and include a plurality of second transparent electrodes 5. As shown in FIGS. 3 and 4, the plurality of second transparent electrodes 5 are disposed on the front surface 2a of the substrate 2. Thus, the second transparent electrodes 5 are disposed on the same surface as the first transparent electrodes 4 (the front surface 2a of the substrate 2). The individual second transparent electrodes 5 are coupled together via the elongated bridge wiring parts 10 in the X1-X2 direction (second direction). The second electrode strings 12, which include the plurality of second transparent electrodes 5 coupled together in the X1-X2 direction, are arranged at a distance from each other in the Y1-Y2 direction. The bridge wiring parts 10 are formed independently of the second transparent electrodes 5. The X1-X2 direction intersects the Y1-Y2 direction. For example, the X1-X2 direction intersects the Y1-Y2 direction perpendicularly.

The second transparent electrodes 5 are light-transmissive and are formed of a material containing conductive nanowires. The conductive nanowires are as described above for the material for the first transparent electrodes 4.

As shown in FIG. 3, each of the bridge wiring parts 10 is composed of two contact portions 10A1 and 10A2, each in contact with one of the two adjacent second transparent electrodes 5 and 5, and a bridge portion 10B provided continuously with the contact portions 10A1 and 10A2 and separated from the two adjacent second transparent electrodes 5 and 5.

Each of the contact portions 10A1 and 10A2 has a multilayer structure. Specifically, each of the contact portions 10A1 and 10A2 includes at least a layer in contact with the second transparent electrode 5 and a layer different from that layer and located farther from the second transparent electrode 5. In the case of the structure shown in FIG. 3, each of the bridge wiring parts 10 is composed, in its entirety, of a layer (first layer) 101 including portions in contact with the second transparent electrodes 5 and a second layer 102 located farther than the first layer 101.

The first layer 101 is formed of a zinc-oxide-based material. Although the reason is not fully understood, a layer formed of a zinc-oxide-based material tends to have a lower contact resistance with the second transparent electrodes 5 containing the conductive nanowires. In particular, the contact resistance tends not to increase after a test is carried out in a high-temperature, high-humidity (e.g., 85° C. and a relative humidity of 85%) environment (8585 test) for a long period of time (e.g., 100 hours). Specifically, a layer formed of a zinc-oxide-based material has a lower contact resistance with the second transparent electrodes 5 containing the conductive nanowires after an 8585 test than a layer formed of indium tin oxide (ITO), which is a typical transparent conductive material. Thus, the use of a zinc-oxide-based material as a material for the layer (first layer) 101 including portions in contact with the second transparent electrodes 5 allows for a reduction in the resistance between the two adjacent second transparent electrodes 5 and 5. The zinc-oxide-based material may include at least one of zinc oxide (ZnO) and indium zinc oxide (IZO) or may be composed of zinc oxide (ZnO) or indium zinc oxide (IZO).

The surface (farther surface) 10a of the bridge wiring parts 10 located farther from the substrate 2 is formed of an amorphous-oxide-based material. In the case of the structure shown in FIG. 3, the farther surface 10a is the surface of the second layer 102; therefore, the second layer 102 is formed of an amorphous-oxide-based material. Amorphous-oxide-based materials are less visible than zinc-oxide-based materials. Therefore, if the farther surface 10a is formed of an amorphous-oxide-based material, the visibility of the bridge wiring part 10 can be reduced. Specific examples of amorphous-oxide-based materials include amorphous indium tin oxide (ITO), amorphous gallium-doped zinc oxide (GZO), amorphous aluminum-doped zinc oxide (AZO), and amorphous fluorine-doped zinc oxide (FTO).

Figure 5:
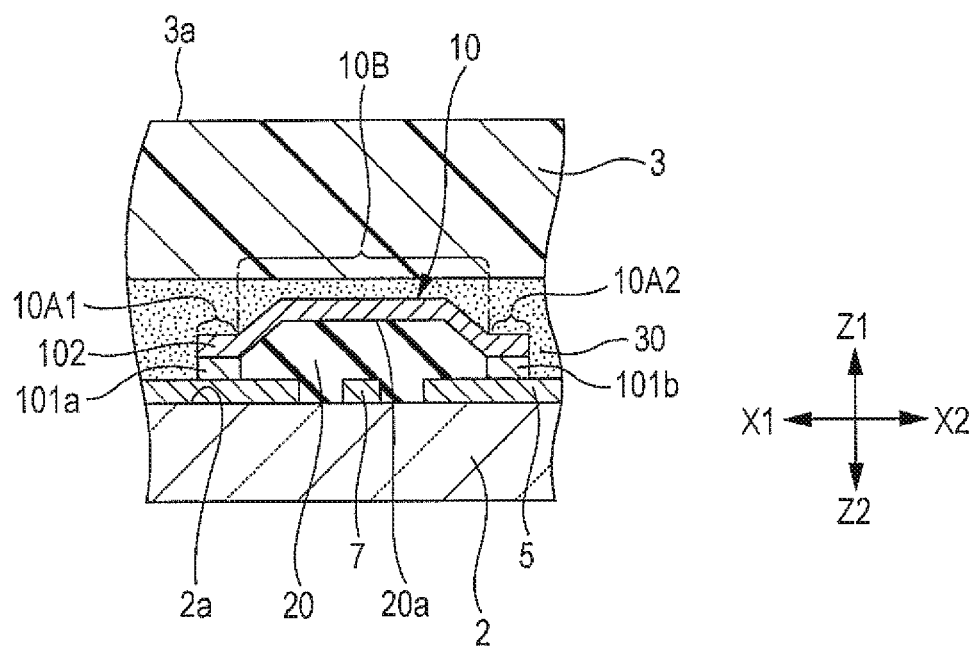
FIG. 5 is a partial sectional view, corresponding to FIG. 3, of a capacitive sensor according to a modification of the embodiment.

FIG. 5 is a partial sectional view, corresponding to FIG. 3, of a capacitive sensor according to a modification of this embodiment. As shown in FIG. 5, in each of the bridge wiring parts 10 of the capacitive sensor according to this modification, the contact portion 10A1 has a multilayer structure composed of a first layer 101a and the second layer 102, and the contact portion 10A2 has a multilayer structure composed of a first layer 101b and the second layer 102. In contrast, the bridge portion 10B has a single-layer structure composed of the second layer 102. It is preferred that the first layers 101a and 101b, which are formed of a zinc-oxide-based material, be present in the contact portions 10A1 and 10A2 since the contact resistance with the second transparent electrodes 5 can be reduced. However, the first layers 101a and 101b are more visible than the second layer 102, which is formed of an amorphous-oxide-based material. Thus, a layer formed of a zinc-oxide-based material need not necessarily be located in the bridge portion 10B, as long as the second layer 102, which is formed of an amorphous-oxide-based material and is therefore relatively invisible, is located in the bridge portion 10B.

The bridge wiring parts 10 may include layers other than the first layer 101 (101a and 101b), which is formed of a zinc-oxide-based material, and the second layer 102, which is formed of an amorphous-oxide-based material. Examples of such layers include layers formed of metals that have lower resistance and higher transparency than the first layer 101 (101a and 101b) and the second layer 102.

As shown in FIGS. 2 to 4, the insulating layers 20 are disposed over the surfaces of the coupling parts 7 coupling the individual first transparent electrodes 4. As shown in FIG. 3, the insulating layers 20 fill the spaces between the coupling parts 7 and the second transparent electrodes 5 and also extend to some extent onto the surfaces of the second transparent electrodes 5. The insulating layers 20 are formed of, for example, a novolac resin (resist).

As shown in FIGS. 3 and 4, the bridge wiring parts 10 extend from the surfaces 20a of the insulating layers 20 to the surfaces of the second transparent electrodes 5 located on both sides of the insulating layers 20 in the X1-X2 direction. The bridge wiring parts 10 electrically connect two adjacent second transparent electrodes 5 to each other.

As shown in FIGS. 3 and 4, the insulating layers 20 are disposed over the surfaces of the coupling parts 7 connecting the individual first transparent electrodes 4, and the bridge wiring parts 10 connecting the individual second transparent electrodes 5 are disposed on the surfaces of the insulating layers 20. Thus, the insulating layers 20 are disposed between the coupling parts 7 and the bridge wiring parts 10 and electrically insulate the first transparent electrodes 4 from the second transparent electrodes 5. In this embodiment, the first transparent electrodes 4 and the second transparent electrodes 5 are disposed on the same surface (the front surface 2a of the substrate 2), which allows for a reduction in the thickness of the capacitive sensor 1.

The coupling parts 7 shown in FIGS. 2 to 4 are formed integrally with the first transparent electrodes 4 and extend in the Y1-Y2 direction. The bridge wiring parts 10 shown in FIGS. 2 to 4 are formed independently of the second transparent electrodes 5 on the surfaces 20a of the insulating layers 20 covering the coupling parts 7 and extend in the X1-X2 direction. The coupling parts 7 and the bridge wiring parts 10, however, are not limited to this arrangement. For example, the coupling parts 7 may be formed integrally with the second transparent electrodes 5 and may extend in the X1-X2 direction. In this case, the coupling parts 7 electrically connect two adjacent second transparent electrodes 5 to each other. The bridge wiring parts 10 may be formed independently of the first transparent electrodes 4 on the surfaces 20a of the insulating layers 20 covering the coupling parts 7 and may extend in the Y1-Y2 direction. In this case, the bridge wiring parts 10 electrically connect two adjacent first transparent electrodes 4 to each other. The description of the capacitive sensor 1 according to this embodiment provides an example in which the bridge wiring parts 10 are formed independently of the second transparent electrodes 5 on the surfaces 20a of the insulating layers 20 covering the coupling parts 7 and extend in the X1-X2 direction.

As shown in FIG. 1, a plurality of wiring parts 6 routed from the first electrode strings 8 and the second electrode strings 12 are formed in the non-sensing region 25. The first electrode strings 8 and the second electrode strings 12 are electrically connected to the wiring parts 6 via connection wiring lines 16. The wiring parts 6 are connected to external connection parts 27 electrically connected to a flexible printed board (not shown). That is, the wiring parts 6 electrically connect the first electrode strings 8 and the second electrode strings 12 to the external connection parts 27. The external connection parts 27 are electrically connected to the flexible printed board (not shown), for example, via conductive paste.

The wiring parts 6 are formed of a material including a metal such as Cu, a Cu alloy, a CuNi alloy, Ni, Ag, or Au. The connection wiring lines 16 are formed of a transparent conductive material such as ITO and extend from the sensing region 11 into the non-sensing region 25. The wiring parts 6 overlie the connection wiring lines 16 in the non-sensing region 25 and are electrically connected to the connection wiring lines 16.

The wiring parts 6 are disposed within the non-sensing region 25 of the front surface 2a of the substrate 2. As with the wiring parts 6, the external connection parts 27 are disposed within the non-sensing region 25 of the front surface 2a of the substrate 2.

In FIG. 1, the wiring parts 6 and the external connection parts 27 are shown as visible for ease of understanding; in practice, a light-blocking decorative layer (not shown) is disposed within the non-sensing region 25. Thus, as the capacitive sensor 1 is viewed from the protective layer 3 side, the wiring parts 6 and the external connection parts 27 are hidden and made invisible by the decorative layer. The decorative layer may be formed of any light-blocking material. The decorative layer may have insulating properties.

As shown in FIG. 3, for example, when a finger, which is an example of a manipulating object, touches the surface 3a of the protective layer 3 of the capacitive sensor 1 according to this embodiment, capacitors are formed between the finger and the first transparent electrode 4 close to the finger and between the finger and the second transparent electrode 5 close to the finger. Based on the resulting change in capacitance, the capacitive sensor 1 can calculate the position touched by the finger. The capacitive sensor 1 determines the X coordinate of the finger position based on the change in capacitance between the finger and the first electrode strings 8 and determines the Y coordinate of the finger position based on the change in capacitance between the finger and the second electrode strings 12 (self-capacitance sensing type).

Alternatively, the capacitive sensor 1 may be of mutual capacitance sensing type. Specifically, the capacitive sensor 1 may apply a drive voltage to one electrode string of one of the first electrode strings 8 and the second electrode strings 12 and sense the change in capacitance between the electrodes of the other of the first electrode strings 8 and the second electrode strings 12 and the finger. In this way, the capacitive sensor 1 determines the X coordinate of the finger position using one type of electrode and determines the Y coordinate of the finger position using the other type of electrode.

Next, example applications of the capacitive sensor 1 according to this embodiment will be described. FIGS. 6A to 7B are schematic views of example applications.

Figure 6A:
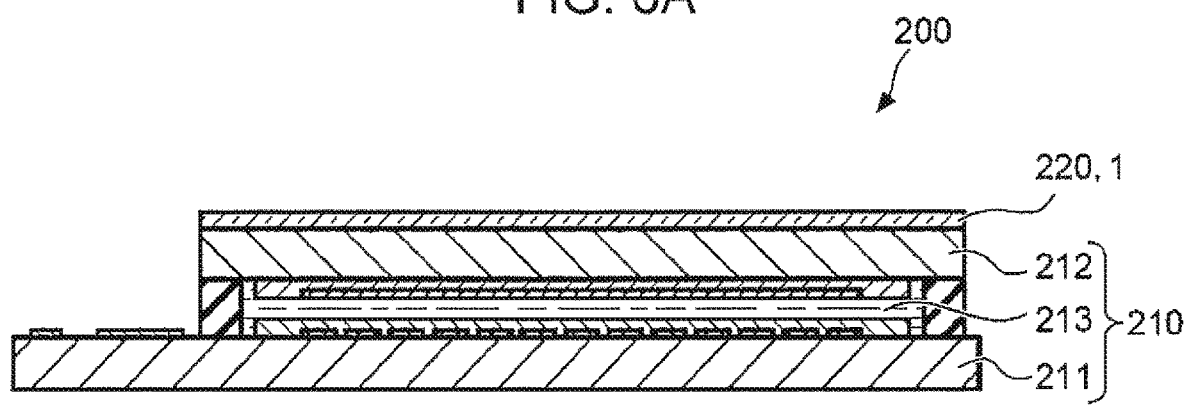
FIGS. 6A and 6B are schematic views of an example application.

FIG. 6A shows an example application of the capacitive sensor 1 to a touch panel 200. The touch panel 200 includes a display panel 210 and the capacitive sensor 1 on the display panel 210. The display panel 210 is, for example, a liquid crystal display panel. The display panel 210 composed of a liquid crystal display panel includes a drive substrate 211 and a counter substrate 212 that are disposed opposite each other and a liquid crystal layer 213 between the drive substrate 211 and the counter substrate 212. A touch sensor 220 is disposed on the front side of the counter substrate 212.

Figure 6B:
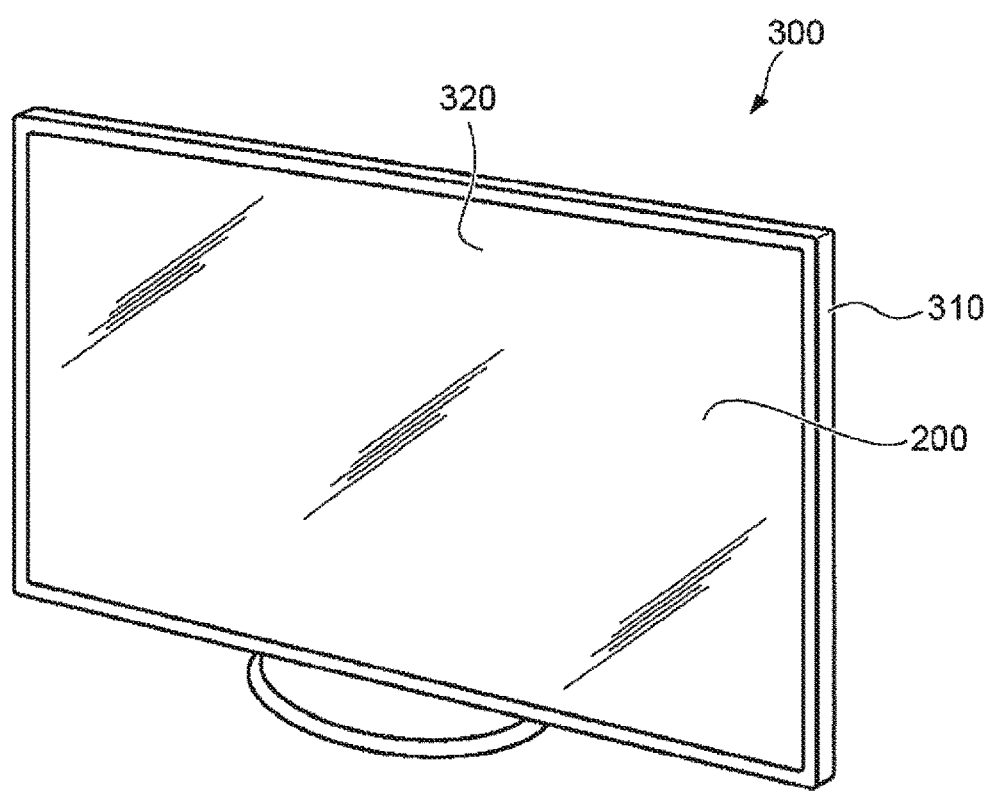

FIG. 6B shows an example electronic device 300 including the touch panel 200. The electronic device 300 is, for example, a television. The electronic device 300 includes a housing 310 and a display unit 320. The touch panel 200 is disposed on the surface of the display unit 320. The electronic device 300 is not limited to a television, but may be another device such as a smartphone, cellular phone, or tablet terminal. The capacitive sensor 1 may also be applied to other applications, including electrical appliances such as refrigerators and washing machines and transportation equipment such as automobiles and ships.

Figure 7A:
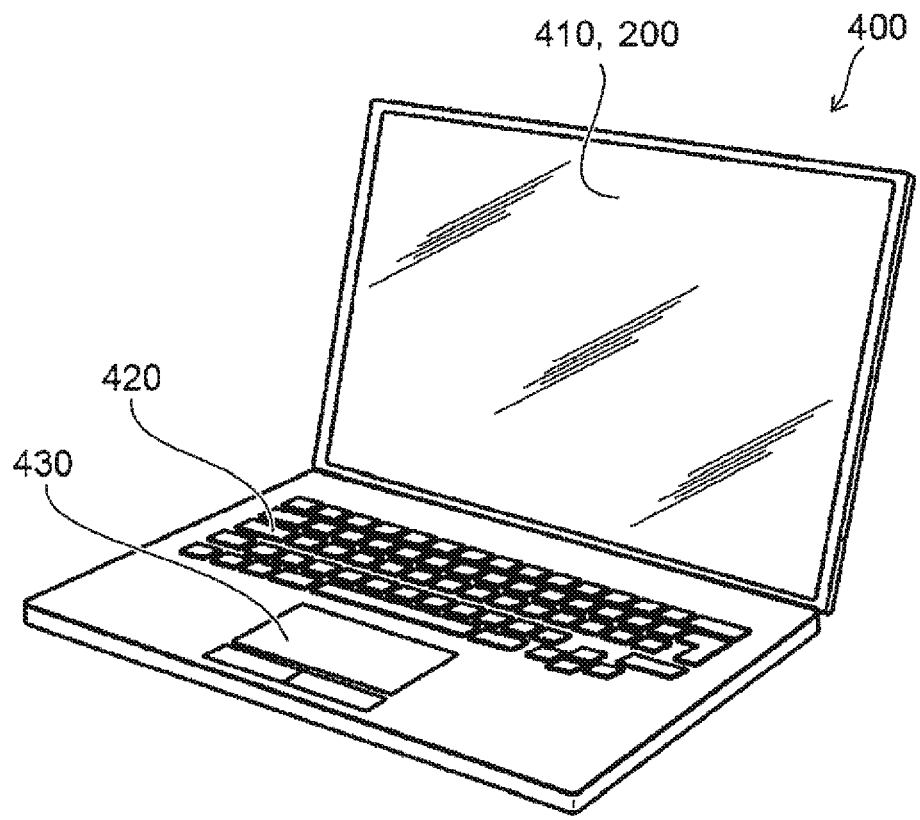
FIGS. 7A and 7B are schematic views of an example application.
Figure 7B:
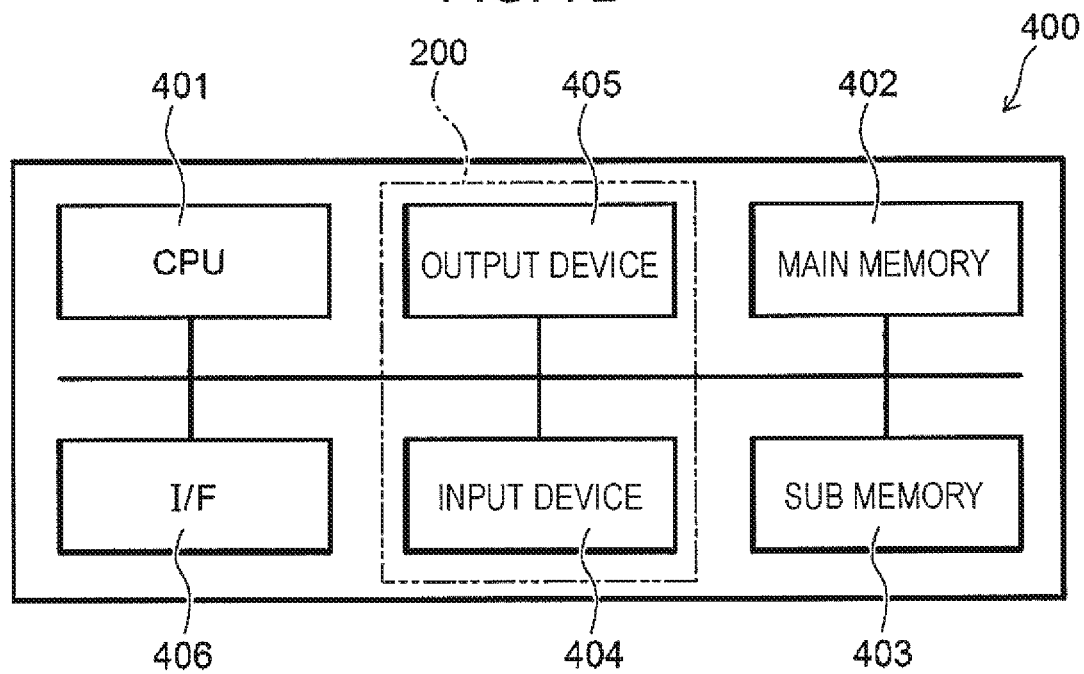

FIG. 7A shows an example computer 400 (notebook computer) including the touch panel 200. The computer 400 includes, for example, a display 410, a keyboard 420, and an input pad 430. As shown in FIG. 7B, the computer 400 includes a central processing unit 401, a main memory 402, a sub memory 403, an input device 404, an output device 405, and an interface 406. The keyboard 420 and the input pad 430 are examples of the input device 404. The display 410 is an example of the output device 405. The display 410 includes the touch panel 200. The touch panel 200 is an example of a combination of the input device 404 and the output device 405.

If the capacitive sensor 1 according to this embodiment is applied to such a device, the capacitive sensor 1 can accurately determine the contact position and send input instructions to the device.

As described above, this embodiment can provide a method for manufacturing a capacitive sensor by which capacitive sensors including bridge wiring lines at intersections of a plurality of electrode layers can be manufactured with high productivity, and can also provide a capacitive sensor.

Although embodiments and example applications thereof have been described above, these examples are not intended to limit the present invention. For example, suitable additions, deletions, and design changes to the elements of the foregoing embodiments and example applications thereof and suitable combinations of the features of the embodiments that are made by those skilled in the art are also included in the scope of the present invention as long as they possess the spirit of the present invention. For example, in the foregoing description, the optical clear adhesive layer 30 is disposed between the structure including the first electrode strings 8 and the second electrode strings 12 disposed on the substrate 2 and the protective layer 3; however, the present invention is not limited to this configuration. The protective layer 3 may be disposed so as to cover the structure including the first electrode strings 8 and the second electrode strings 12 disposed on the substrate 2. This configuration can be obtained, for example, by applying a composition for forming the protective layer 3 to the above structure and curing the coating to form the protective layer 3.

EXAMPLES

The present invention will now be more specifically described with reference to the following Example and other examples, although they are not intended to limit the scope of the present invention.

Example 1

Figure 8:
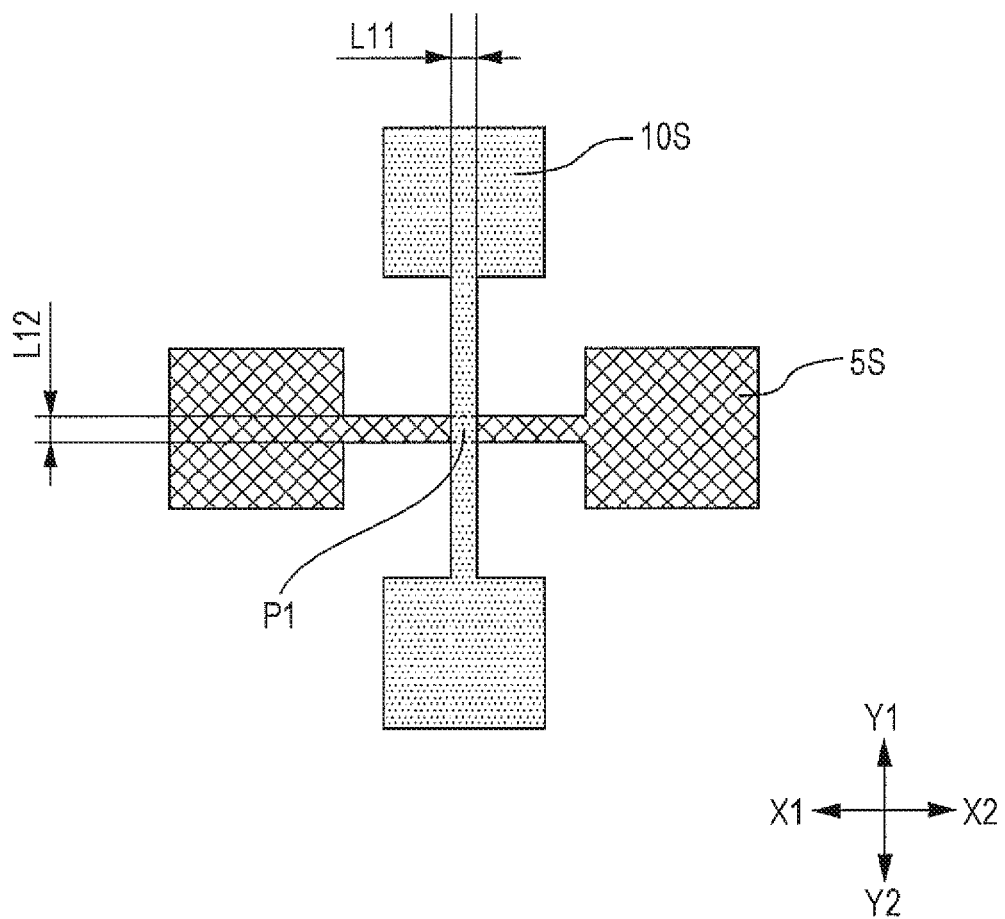
FIG. 8 is a schematic plan view of an example Kelvin pattern.

FIG. 8 is a schematic plan view of an example Kelvin pattern. Using the kelvin pattern shown in FIG. 8, a first sample 5S containing silver nanowires and a second sample 10S formed of zinc oxide were arranged so as to intersect each other. The first sample 5S corresponds to the second transparent electrodes 5. The second sample 10S corresponds to the first layer 101 (101a and 101b) of the bridge wiring parts 10. In this test, one of the length L11 of a contact portion P1 in the Y1-Y2 direction and the length L12 of the contact portion P1 in the X1-X2 direction was fixed at 100 μm, and the other of the length L11 and the length L12 was varied so that the contact portion P1 had varying contact areas. In this way, a plurality of kelvin patterns having contact portions P1 with different contact areas were provided.

Comparative Examples 1 and 2

A plurality of kelvin patterns having contact portions P1 with different contact areas were provided as in Example 1 except that the second sample 10S was replaced with two types of comparative samples formed of indium tin oxide (ITO) that were manufactured by different methods.

Figure 9:
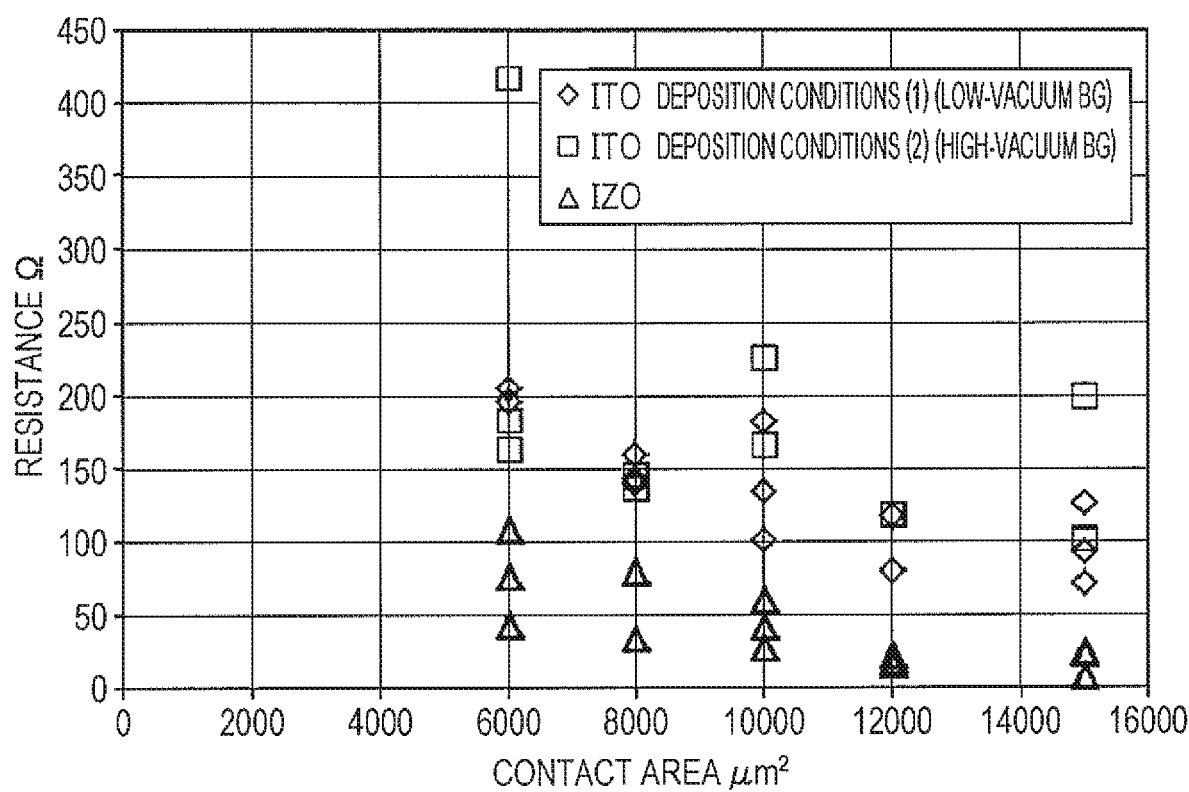
FIG. 9 is a graph showing the relationship between the contact area and the electrical resistance Rc of a contact portion P1.

Measurement Example: Electrical Resistance Measurement after 8585 Reliability Test The kelvin patterns were subjected to an environment test in which they were allowed to stand in an environment with a temperature of 85° C. and a relative humidity of 85% for 240 hours (8585 reliability test). The electrical resistances Rc (unit: SI) of the contact portions P1 of the kelvin patterns after the test were measured. FIG. 9 is a graph showing the relationship between the contact area and the electrical resistance Rc of the contact portion P1 between the first sample 5S and the second sample 10S or the comparative samples.

As shown in FIG. 9, the electrical resistances Rc of the kelvin patterns of Example 1 were lower than those of the kelvin patterns of Comparative Examples 1 and 2 at any contact area.

What is claimed is:

1. A capacitive sensor comprising:
   a light-transmissive substrate having a sensing region on a main surface thereof;
   a plurality of first transparent electrodes arranged side by side in the sensing region in a first direction, the first transparent electrodes being light-transmissive;
   a plurality of second transparent electrodes arranged side by side in the sensing region in a second direction intersecting the first direction, the second transparent electrodes being light-transmissive and comprising conductive nanowires;
   coupling parts provided integrally with the first transparent electrodes and electrically connecting two adjacent first transparent electrodes to each other; and
   bridge wiring parts provided independently of the second transparent electrodes so as to intersect the coupling parts and electrically connecting two adjacent second transparent electrodes to each other,
   wherein each of the bridge wiring parts comprises:
      a pair of contact portions, each having a multilayer structure and being in contact with corresponding one of the two adjacent second transparent electrodes, the multi layer structure comprising a first layer which has a portion in contact with the second transparent electrode, the first layer including a zinc-oxide-based material; and
      a bridge portion provided between and continuously formed with the pair of contact portions, the bridge portion being separated from the two adjacent second transparent electrodes, a surface of the bridge portion located farther from the substrate comprising an amorphous-oxide-based material.

2. The capacitive sensor according to claim 1, wherein the multilayer structure further comprises a second layer disposed farthest from the second transparent electrodes, the second layer including the amorphous-oxide-based material.

3. The capacitive sensor according to claim 1, wherein the bridge portion comprises a third layer formed of the amorphous-oxide-based material.

4. The capacitive sensor according to claim 1, wherein the bridge portion has a multilayer structure comprising:
   a third layer having the surface comprising the amorphous-oxide based material; and
   a fourth layer provided closer to the substrate than the third layer is, the fourth layer being formed continuously with the first layer and comprising the zinc-oxide-based material.

5. The capacitive sensor according to claim 2, wherein the bridge portion has a multilayer structure comprising:
   a third layer having the surface comprising the amorphous-oxide based material, the third layer being formed continuously with the second layer; and
   a fourth layer provided closer to the substrate than the third layer is, the fourth layer being formed continuously with the first layer and comprising the zinc-oxide-based material.

6. The capacitive sensor according to claim 3, wherein the bridge portion has a multilayer structure comprising a fourth layer provided closer to the substrate than the third layer is, the fourth layer being formed continuously with the first layer and comprising the zinc-oxide-based material.

7. The capacitive sensor according to claim 1, wherein the zinc-oxide-based material comprises at least one of zinc oxide and indium zinc oxide.

8. The capacitive sensor according to claim 1, wherein the conductive nanowires are at least one selected from the group consisting of gold nanowires, silver nanowires, and copper nanowires.

9. The capacitive sensor according to claim 1, wherein the amorphous-oxide-based material is at least one selected from the group consisting of amorphous ITO, amorphous GZO, amorphous AZO, and amorphous FTO.

10. The capacitive sensor according to claim 2, wherein the amorphous-oxide-based material is at least one selected from the group consisting of amorphous ITO, amorphous GZO, amorphous AZO, and amorphous FTO.

11. A device comprising the capacitive sensor according to claim 1.

* * * * *